(12) United States Patent
Skrbic et al.

(10) Patent No.: US 10,988,045 B2
(45) Date of Patent: Apr. 27, 2021

(54) METHOD FOR DETECTING PROFILES OF CHARGING CURRENTS

(71) Applicants: Srdan Skrbic, Dortmund (DE); Jürgen Waffner, Essen (DE)

(72) Inventors: Srdan Skrbic, Dortmund (DE); Jürgen Waffner, Essen (DE)

(73) Assignee: innogy SE, Essen (DE)

( * ) Notice: Subject to any disclaimer, the term of this patent is extended or adjusted under 35 U.S.C. 154(b) by 0 days.

(21) Appl. No.: 16/817,158

(22) Filed: Mar. 12, 2020

(65) Prior Publication Data

US 2020/0207236 A1 Jul. 2, 2020

Related U.S. Application Data

(63) Continuation of application No. PCT/EP2018/068673, filed on Jul. 10, 2018.

(30) Foreign Application Priority Data

Sep. 12, 2017 (DE) .................. 10 2017 121 034.2

(51) Int. Cl.
*B60L 53/66* (2019.01)
*B60L 53/67* (2019.01)
*B60L 53/62* (2019.01)
*B60L 53/65* (2019.01)
*G01R 19/165* (2006.01)
*G06Q 50/06* (2012.01)

(52) U.S. Cl.
CPC .............. *B60L 53/665* (2019.02); *B60L 53/62* (2019.02); *B60L 53/65* (2019.02); *B60L 53/67* (2019.02); *G01R 19/16542* (2013.01); *G06Q 50/06* (2013.01)

(58) Field of Classification Search
CPC ......... B60L 53/665; B60L 53/67; B60L 53/66
USPC ........................................................ 320/109
See application file for complete search history.

(56) References Cited

U.S. PATENT DOCUMENTS

| 8,823,330 B2 * | 9/2014 | Ree ...................... B60L 11/1846 |
| | | 320/162 |
| 8,965,669 B2 * | 2/2015 | Fisher ...................... B60L 58/12 |
| | | 701/117 |
| 9,118,183 B2 * | 8/2015 | Erger ...................... H02J 7/0027 |
| 10,393,849 B2 * | 8/2019 | Salem ...................... B60L 53/31 |

(Continued)

FOREIGN PATENT DOCUMENTS

| JP | 2013 110877 A | 6/2013 |
| WO | WO 2013/017161 A1 | 2/2013 |

*Primary Examiner* — Richard V Muralidar
(74) *Attorney, Agent, or Firm* — Reinhart Boerner Van Deuren P.C.

(57) ABSTRACT

A method for detecting charging current curves for electric vehicles at charging stations. In the method, a charging current curve is captured at a charging station, and the charging current curve is stored together with a vehicle identification of the charging vehicle. For each respective vehicle identification, a charging current curve at a plurality of charging stations is stored, and for the respective vehicle identification, a present charging current curve can be compared with the stored charging current curves at the plurality of charging stations. In the event of a deviation of the present charging current curve from the stored charging current curves at the plurality of charging stations which is greater than a threshold, a signal is output.

14 Claims, 7 Drawing Sheets

(56) References Cited

U.S. PATENT DOCUMENTS

| | | | |
|---|---|---|---|
| 2003/0218446 A1* | 11/2003 | Beerwerth | H02J 7/0072 |
| | | | 320/128 |
| 2012/0166011 A1 | 6/2012 | Oba et al. | |
| 2017/0170871 A1 | 6/2017 | Goyal et al. | |
| 2018/0011143 A1* | 1/2018 | Bruch | G01R 31/3835 |
| 2019/0039469 A1* | 2/2019 | Skrbic | B60L 3/04 |
| 2020/0231061 A1* | 7/2020 | Kanamori | B60L 58/12 |

* cited by examiner

METHOD FOR DETECTING PROFILES OF CHARGING CURRENTS

CROSS-REFERENCE TO RELATED PATENT APPLICATIONS

This patent application is a continuation of PCT/EP2018/068673, filed Jul. 10, 2018, which claims the benefit of German Patent Application No. DE 10 2017 121 034.2, filed Sep. 12, 2017, the entire teachings and disclosure of which are incorporated herein by reference thereto.

FIELD

The subject matter relates to a method for capturing the curve of charging currents for electric vehicles at charging stations.

BACKGROUND

Charging stations are equipped with measuring devices, so-called smartmeters, which measure the charging current and thus the electrical energy drawn by the charging vehicle. The costs to be invoiced to the customer are at least partially calculated from the measured values of the smartmeters in the charging stations or in a central computer (backend).

For a central processing of the charging information, in particular the information on the charging current as well as on the energy drawn, the charging stations or their smartmeters are connected to a central computer via a wide area network. Within the charging station, the smartmeters are connected to the controller of the charging station, in particular via a bus system.

Usually, a charging station that no longer reacts or a smartmeter that no longer reacts is classified as defective and a service technician can inspect the charging station and the measuring device on site and correct the defect if necessary.

However, measuring devices which measure a charging current and thus an energy but this measurement is incorrect are problematic. These charging stations still report billing-relevant data to the backend. However, there, it is not possible to tell whether the data is based on a correct or an incorrect measurement. Therefore, it is almost impossible so far to conclude directly from received measured values that a measuring device in a charging station is defective.

BRIEF SUMMARY

For this reason, the subject matter was based on the object of being able to detect defective measuring devices in a charging station.

Due to the mass use of charging stations, which are spatially widely distributed, a comprehensive, continuous on-site diagnosis of charging stations and their measurement equipment is impossible. However, it must be ensured that the measurement results are correct and that the customers are invoiced for correct amounts of energy.

The inventors have found that defective measuring devices can be detected by their recorded charging curves deviating from the charging curves of other charging stations. In addition, the inventors have found that such a deviation can also be due to the vehicle type or the respective vehicle and therefore a defective measuring equipment can only be detected in a charging station if the vehicle identification is taken into account.

It is now proposed to first record the curve of a charging current in a charging station. A curve of a charging current can also be understood as a charging trajectory.

In addition, it is proposed that the recorded curve of the charging current is stored together with a vehicle identification of the charging vehicle. Thus, the charging current and a corresponding vehicle identification are stored in a memory for each charging process. This makes it possible to evaluate different charging currents for the same vehicle. Such an evaluation can also be carried out across a large number of charging stations, as the storage and subsequent evaluation of the charging curves can in particular be carried out in a central computer.

It is proposed that for each vehicle identification a charging current curve is stored at a plurality of charging stations. A vehicle moving in the field usually charges at different charging stations. Each of these charging processes can be unambiguously associated with the vehicle using the vehicle identification. Thus, a plurality of charging curves of a single vehicle can be received and stored in the central computer.

If a vehicle is now charging at a charging station, a present curve of the charging current is recorded and stored. This present curve of the charging current can afterwards be compared with stored charging current curves of the respective vehicle at the plurality of charging stations. This means that when a vehicle is charging at one charging station, this charging process can be compared with other charging processes of this vehicle at other charging stations. By comparing the charging processes of the same vehicle, it can be ruled out that differences in charging curves are caused by different vehicles.

By means of the comparison between a present charging current curve and stored charging current curves at a plurality of charging stations for a particular vehicle identification, it is possible to determine whether a charging station behaves conspicuously in relation to other charging stations.

For this purpose, it is proposed that if the present charging current curve deviates from the stored charging current curves at the plurality of charging stations that is greater than a limit, a signal is output.

By suitable comparisons of the charging current curves, in particular by suitable comparisons of the charging curves, it is possible to determine whether a present charging curve deviates significantly from previous charging curves, i.e. whether a deviation is greater than a threshold. In this case, a signal can be output.

It is proposed that for a plurality of charging stations, charging current curves are stored together with a vehicle identification of the charging vehicle. This storage preferably takes place in a central backend, which is connected to the respective charging stations via a wide area network. Using the vehicle identification, all charging processes of a single vehicle at different charging stations can then be established and evaluated. This is of particular interest for determining whether a charging curve at a charging station by a particular vehicle differs from charging curves at other charging stations by this vehicle. This can be a hint that the charging station at which the present charging process is running or has just been completed is defective.

However, it is also possible that a vehicle has become defective between two charging processes. Such a charging process would be qualified as defective if the previous charging processes of this vehicle at other charging stations alone were used and the charging station would be serviced on site.

In order to rule out such a case, it is proposed that the charging current curves for a plurality of vehicle identifications are stored for each of a plurality of charging stations. This means that for each single charging station, the charging curves are also stored for a plurality of vehicles. For example, it may be useful to store the charging current curve and the vehicle identification together with a charging station identification. In this case, the vehicle identification or the charging station identification can be used to filter for charging current curves in the central computer that are associated with a single vehicle or to a single charging station.

A present charging current curve can then be compared with stored charging current curves at the respective charging station. This comparison does not compare the charging current curve at one charging station with the charging current curves at other charging stations, but it is rather compared how the present charging process behaves in relation to previous charging processes at this respective charging station.

It is also proposed that if the present charging current curve deviates from the stored charging current curves at the respective charging station by a threshold, a signal is output.

According to another embodiment, it is proposed that initially, the deviation of the present charging current curve from the stored charging current curves at the plurality of charging stations is evaluated and, if a signal is output, the deviation of the present charging current curve with stored charging current curves at the respective charging station, in particular for different vehicle identifications, is determined. An error signal can be output in the event of a deviation by a threshold.

According to an embodiment, it is proposed that for each vehicle identification a characteristic charging current curve of the vehicle is calculated from the stored charging current curves at different charging stations. If the vehicle moves in the field and charges at different charging stations, the vehicle always behaves in the same way at these charging stations, provided it is not defective. This behavior can be described as a charging current curve characterizing the vehicle. The charging current curve characterizing the vehicle can be determined from a certain number of previous curves. A sliding window over the number of curves can be used. The number can be, for example, between 10, 20, 30 or 50 and 100, 200, 500 or 1000.

It is also proposed that the signal is output when a deviation of the present charging current curve from the charging current curve characterizing the vehicle is above a threshold.

According to an embodiment, it is proposed that for each charging station a charging current curve characterizing the charging station is calculated from the stored charging current curves with different vehicle identifications. The charging station also behaves characteristically during different charging processes with different vehicles. This can be described as a charging current curve characterizing the charging station. The charging current curve characterizing the charging station can be determined from a certain number of previous curves. A sliding window over the number of curves can be used. The number can, for example, be between 10, 20, 30 or 50 and 100, 200, 500 or 1000.

According to an embodiment, it is proposed that the current curve characterizing the vehicle is calculated as the average of the stored charging current curves for the vehicle identification.

According to another embodiment, it is proposed that the charging current curve characterizing the charging station is calculated as the average of the stored charging current curves for the charging station.

A curve of the charging current can be formed from discrete values (sampling points) which are determined, for example, in minute segments, 5-minute segments, 15-minute segments, starting from the beginning or end of the charging. It is also possible that when the charging current reaches a lower threshold, i.e. when the charging has ended, the respective discrete values are determined backwards from this point in time in the time intervals mentioned. Thus, a series of measured values with in particular equidistant time intervals can be formed.

When comparing the charging current curves, for example, it can first be determined at which sampling points (measuring points) the charging currents are equal. Starting from these interpolation points, a comparison of the other interpolation points can be carried out forwards and/or backwards and, for example, a deviation of the amounts of the charging currents can be calculated. In particular, it is possible to compare points with each other that characterize the charging curve. Under comparable underlying conditions, the charging curves of different vehicles are the same in comparable sections. For example, depending on the charging technology used, the charging curve can be shaped differently. An exemplary curve can be:

Empty battery→Start with 60% of the maximum charging power;
Increase to 100% of the maximum charging power after 5 minutes;
slow reduction of charging power after 35 min, until after 50 min they are below 5%. The points at which the power is changed as well as the time intervals between them can be such characterizing points.

Charging processes can also be excluded from the comparison if no maximum charge is drawn, e.g. if a vehicle is almost fully charged when the charging process begins. Then the total charging curve/duration until the charging currents are below 5% can be so short that this charging provides only little comparable data.

According to an embodiment, it is proposed that for each charging station the curves of charging currents with different vehicle identifications are compared with a present charging current curve for a vehicle identification dependent on the signal. This means that initially, the deviation of the charging current curve at the charging station is determined for the respective vehicle identification of charging current curves at other charging stations of this vehicle identification and then the curve is compared to previous charging current curves at the respective charging station.

In addition to the vehicle type, the ambient temperature, the temperature inside the charging station, the battery temperature or the like also play a role. For this reason, it is proposed that a temperature is stored together with the charging current curve. The stored temperature can be at least one of the temperatures mentioned above. It is then possible to assign the recorded and stored charging current curves to a temperature range. Thus it is possible to form multiple temperature ranges, for example at 5° C. intervals. For each of these intervals, the corresponding charging current curves are collected and a charging current curve of the charging current is compared with such curves of charging currents that are associated with the temperature range matching the corresponding present temperature.

The same applies, of curve, to the cable set, in particular the type of cable, the type of plug and the like. If information on the cable set is available, this information can also be saved. The recorded and stored charging currents can then be associated with the corresponding types of cable sets. In this way, a set of charging current curves is recorded for each cable set. A present charging current curve can then be compared with those stored charging current curves which are assigned to the present present cable set.

BRIEF DESCRIPTION OF THE DRAWINGS

In the following, the object is explained in more detail using a drawing showing embodiments. In the drawings.

DETAILED DESCRIPTION

Figure 1:
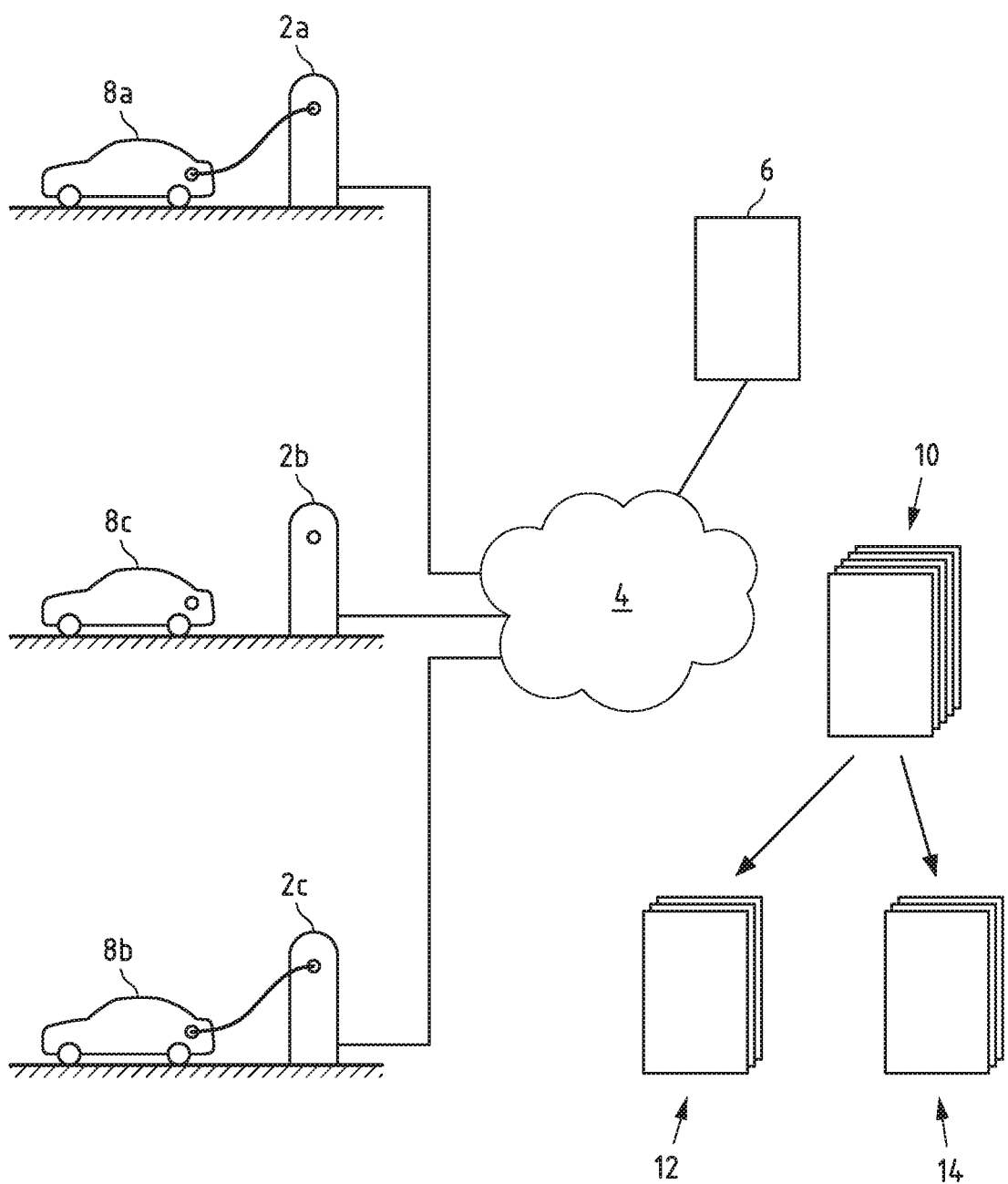
FIG. 1 is a schematic structure of a system for carrying out the method according to the subject-matter.

FIG. 1 shows a system with charging stations 2a-c, a wide area network 4, a central backend 6 as well as three vehicles 8a, b, c.

If one of the vehicles charges 8a, b, c at one of the charging stations 2a-c, the charging station 2a-c continuously measures the charging current and records the amount of energy drawn. Both the curve of the charging current and the amount of energy, recorded in one of the 2a-c charging stations, are transmitted to the backend 6 via the wide area network 4. Together with this transmission, at least one piece of information relating to a vehicle identification and one piece of vehicle information relating to a charging station identification are transmitted.

In the vehicles 8a, b, c is an identification stored respectively which is communicated to charging station 2a-c at the start, during and/or at the end of a charging process. Thereby the charging process can be unambiguously associated to one of the vehicles 8a, b, c. The vehicle identifications of vehicles 8a, b, c differ from each other and, in particular, the vehicle identifications are unambiguous.

The same applies to the charging station identifications. Each charging station 2a-c may have a unique identification which distinguishes charging station 2a-c from the other charging stations 2a-c.

The charging currents are transmitted in particular as series of measured values with equidistant time intervals.

Backend 6 thus has a set 10 of charging current curves. Using the vehicle identification on the one hand, it is possible to filter a set 12 from this set 10, which is to be associated with a specific vehicle in each case. Using a charging station identification, it is possible to filter a set 14 from the set 10, which contains the curves of the charging currents originating from a particular charging station.

Figure 2A:
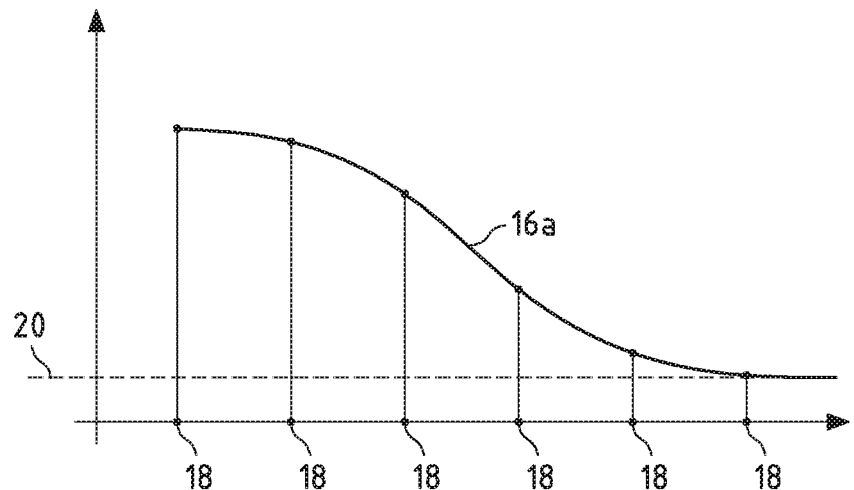
FIGS. 2a-d are different charging current curves at different charging stations for one respective vehicle identification.
Figure 2B:
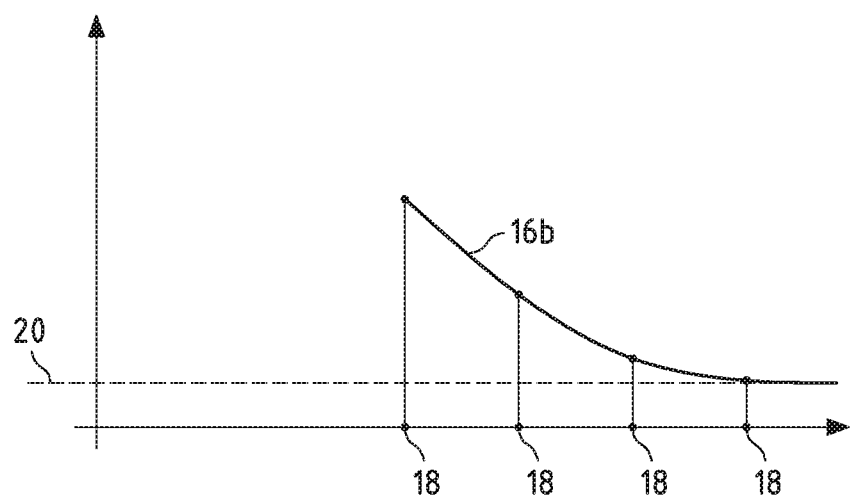
Figure 2C:
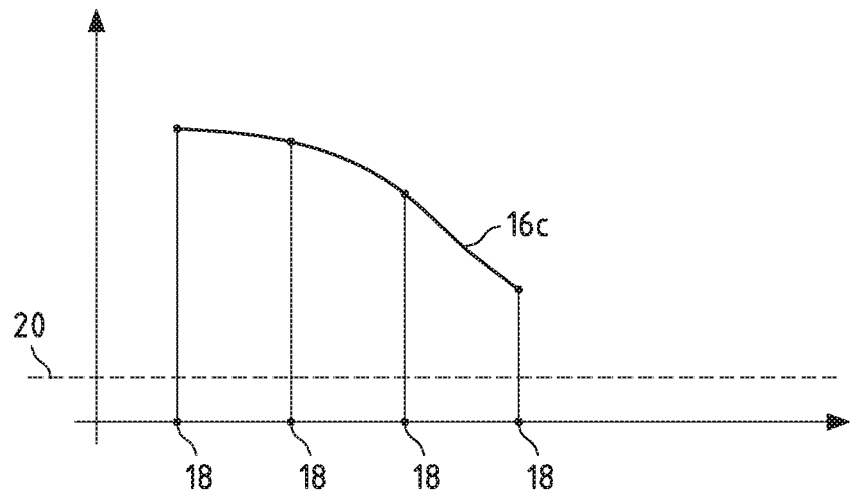

FIGS. 2a-c show, for example, charging current curves from set 12.

For example, FIG. 2a shows a first curve 16a of a charging current of a vehicle 8a. This curve 16a can, for example, be recorded at the charging station 2a. It can be seen that curve 16a can be recorded as a series of equidistant, discrete values 18.

FIG. 2a also shows, for example, that if a lower limit value of 20 is reached, the discrete values 18 are determined at equal time intervals. The discrete values 18 are transmitted via the wide area network 4 from the charging station 2a to the backend 16.

FIG. 2b shows a charging process carried out by vehicle 8a at charging station 2b, for example. This can be curve 16b. It can also be seen here that this curve 16b can be represented by discrete values 18 which are equidistant to each other. In curve 16b as shown in FIG. 2b, it can be seen that the charging process was shorter and, in particular, started at a lower current intensity. This may be due, for example, to the fact that vehicle 8a was already partially charged at charging station 2b at the start of the charging process.

Finally, FIG. 2c shows a curve 16c of a charging process of vehicle 8a at charging station 2c. It can also be seen here that equidistant discrete values 18 are determined from the curve 16c. In this curve 16c, for example, the vehicle was connected to charging station 2c with an almost empty battery, but disconnected before charging was completed.

Figure 2D:
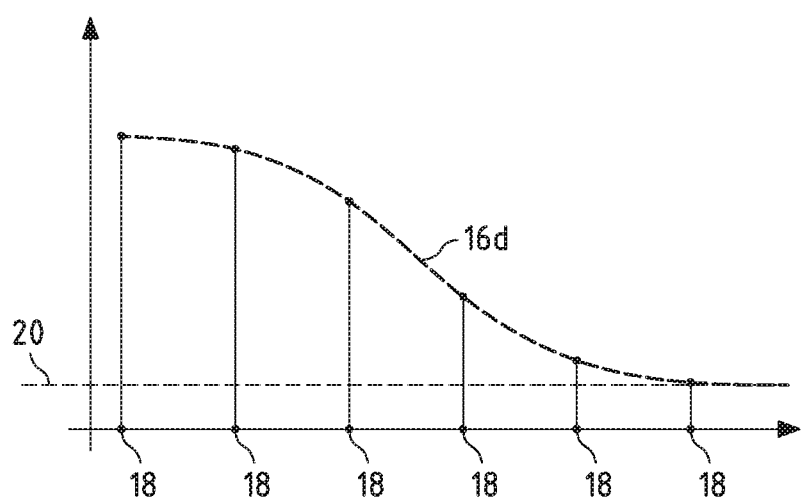

FIG. 2d shows a 16d curve of the charging current characterizing the vehicle. This can be determined by interpolating the 16a-c curves stored in set 12. This curve 16d can also be formed from discrete values 18 as a series. Using all or a large number of 16a-c curves stored in set 12 for the vehicle 8a, for example, the 16d curve characterizing the vehicle can be calculated.

It is also possible for different vehicles to charge 8a-c at one and the same charging station 2a. This is shown as an example in FIGS. 3a-c.

Figure 3A:
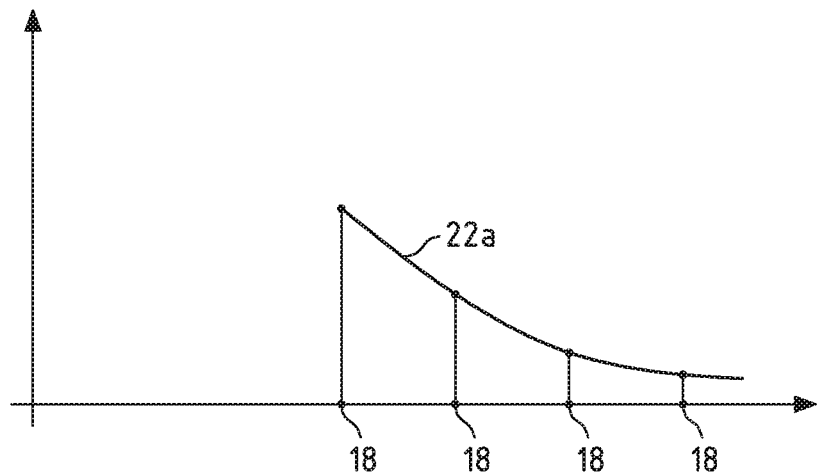
FIGS. 3a-d are different charging current curves at a charging station by different vehicles.
Figure 3B:
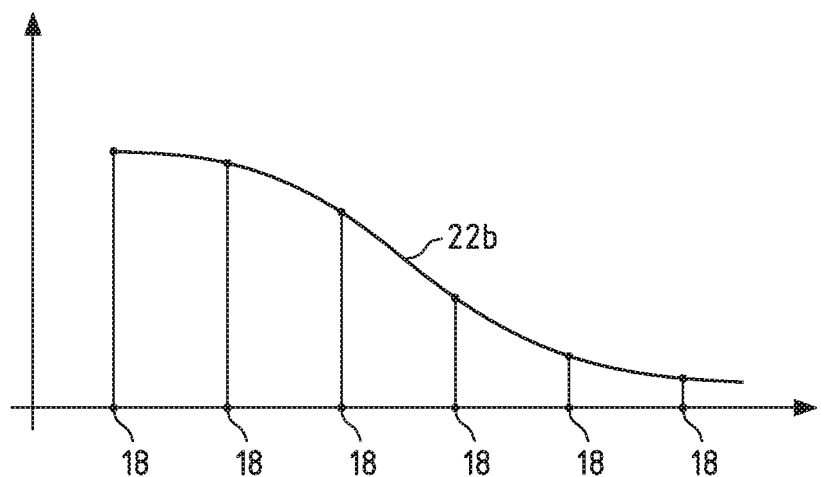
Figure 3C:
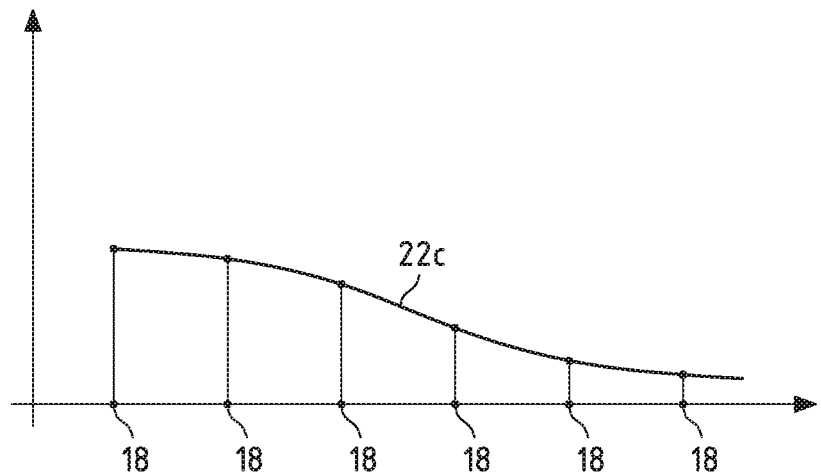

FIGS. 3a-c show, for example, charging currents from set 14.

FIG. 3a shows a curve 22a of a charging process of vehicle 8a at charging station 2a. Again, discrete values 18 are captured equidistantly to each other. The curve 22a can be contained in the backend 6 in the set 10. Using the charging station identification of charging station 2a, this curve 22a can be assigned to set 14, which also applies to the following set 22b and c.

FIG. 3b shows a curve 22b of a charging current which is generated by vehicle 8b while charging at charging station 2a. Here again, the discrete values 18 are captured as a series.

Finally, FIG. 3c shows a curve 22c of a charging process in which the vehicle 8c charges at charging station 2a.

Figure 3D:
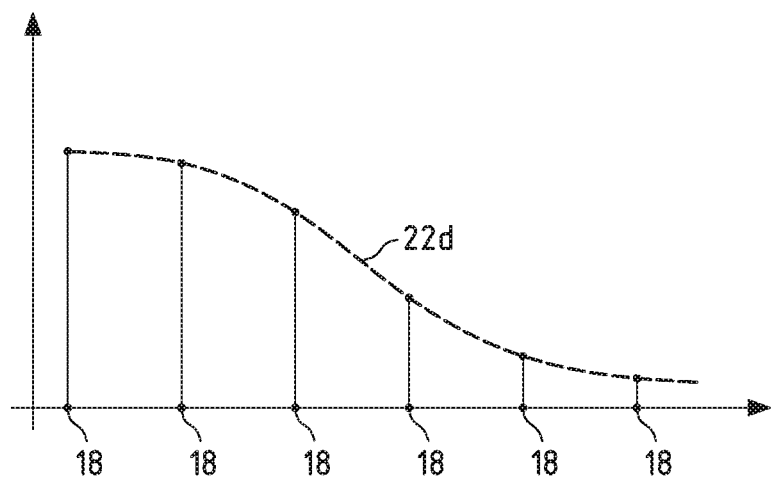

The curves of the charging currents 22a-c have thus all been recorded at charging station 2a and come from different vehicles 8a-c, for example. Using these different curves of charging currents 22a-c, it is possible to calculate the curve 22d characterizing the charging station as shown in FIG. 3d. This curve 22d can, for example, be calculated by interpolating the discrete values 18 of the curves 22a-c. The following table shows the characteristic curve 22d of the charging station. Mean values or the like can also be calculated.

The curves are created from the time as a basis and the charging power as measuring points. The characteristic of a curve can be determined by its max/min values and the time in between. With comparable underlying conditions (charging quantity, weather, station, cable, . . . ) comparable curves (e.g. start charging power, max. charging power, preservation power, charging duration from point A to B) result. In the case of partial chargings, there are partial segments or a non-characteristic partial charging is not statistically taken into account.

Figure 4A:
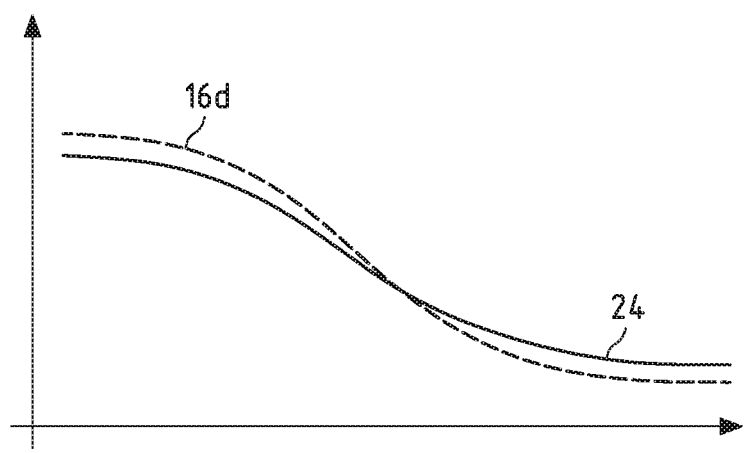
FIGS. 4a,b are comparisons of present charging currents with a charging current characterizing the vehicle.

FIG. 4a shows an example of the comparison of a current curve of a charging current 24 with the curve of the charging current 16d characterising the vehicle. The current curve 24, for example, comes from vehicle 2a at one of the 2a-c charging stations. It can be seen that the deviation is small and in this case it can be assumed that the charging station measured the charging process correctly.

Figure 4B:
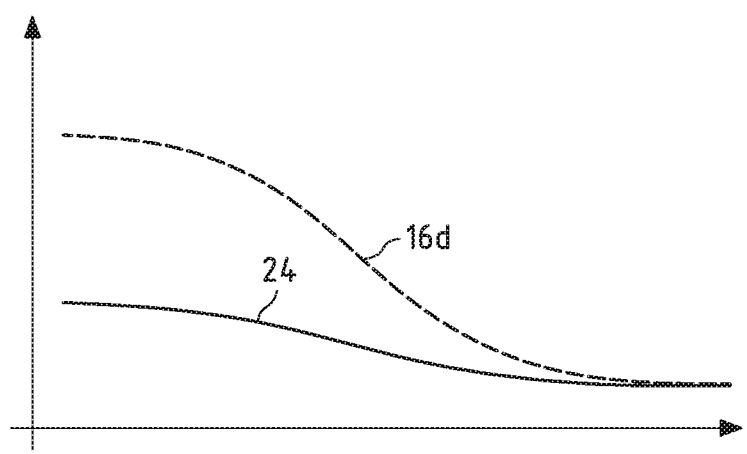

FIG. 4b shows a comparison of a present curve of charging current 24 with the curve 16d characterizing the vehicle. The curve of charging current 24 comes from a current charging of vehicle 8a at one of the 2a-c charging stations. A considerable deviation can be seen between the curve 16d characterizing the vehicle and the current curve 24. This deviation can cause the output of a signal.

It is proposed that a charging curve is represented as a vector image. The max/min values and their linear time reference can be stored as a vector. A comparable 30 min charging process has comparable min/max values and time intervals under the same conditions.

Figure 5A:
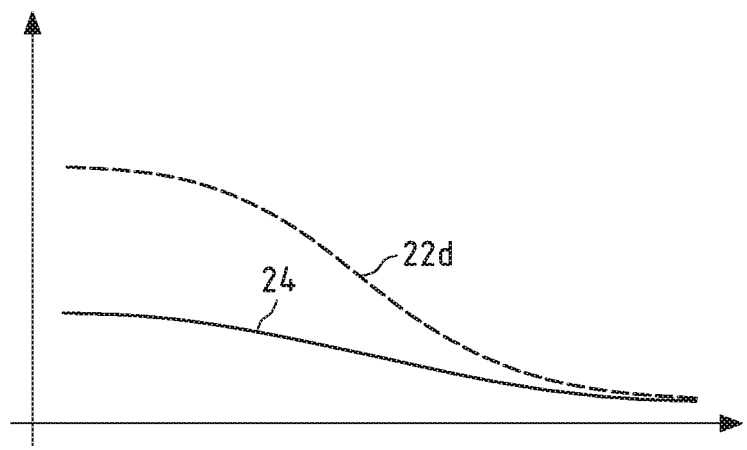
FIGS. 5a,b are comparisons of a present charging current curve with charging current curves characterizing the charging station.

FIG. 5a shows the comparison of the curve of the charging current 24 of FIG. 4b with the curve of the charging current 22d characterising the charging station. It can be seen that the two curves 22d, 24 differ considerably from each other. This means that vehicle 8a at charging station 2a has a charging curve that differs from the previous charging process. This may indicate that it is not charging station 2a that is defective, but vehicle 8a.

Figure 5B:
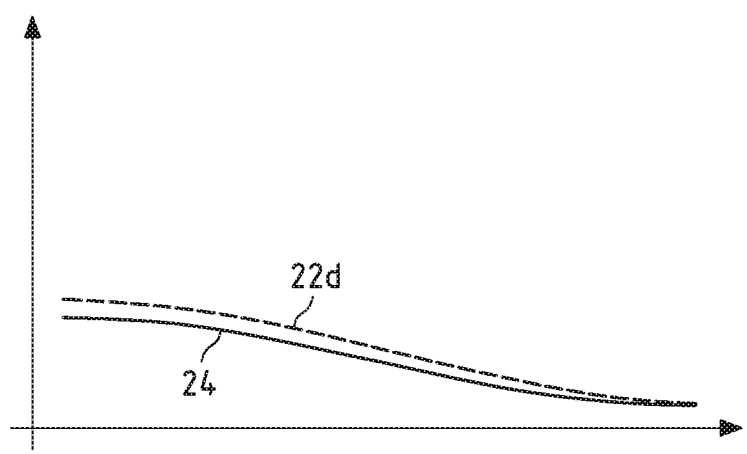

FIG. 5b shows a comparison of curve 24 with curve 22. Here it can be seen that the two curves are almost identical.

If the charging curve of the vehicle 8a deviates from the curve 16d characterising the vehicle according to FIG. 4b and it is afterwards determined that this deviation is not due to the vehicle, since curve 24 of curve 22d is almost identical, it can be concluded that the present charging station is defective.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for capturing charging current curves for electric vehicles at charging stations comprising:
    capturing of a charging current curve at a charging station by the charging station,
    storing of the charging current curve together with a vehicle identification of the charging vehicle in a memory of the charging station,
    wherein
    for each vehicle identification a charging current curve at a plurality of charging stations is stored, and
    for the respective vehicle identification, the charging station compares a present charging current curve with the stored charging current curves at the plurality of charging stations and in case of a deviation of the present charging current curve from the stored charging current curves at the plurality of charging stations which is greater than a threshold, the charging station outputs a signal.

2. The method according to claim 1, wherein for a plurality of charging stations, respective charging current curves are stored together with a vehicle identification of the charging vehicle.

3. The method according to claim 1, wherein charging current curves for a plurality of vehicle identifications are stored in each of a plurality of charging stations.

4. The method according to claim 1, wherein a present charging current curve is compared with stored charging current curves for the respective vehicle identification.

5. The method according to claim 1, wherein a present charging current curve is compared with stored charging current curves at the respective charging station with different vehicle identifications.

6. The method according to claim 1, wherein a charging current characterizing the vehicle is calculated for each respective vehicle identification from the stored charging current curves at different charging stations.

7. The method according to claim 1, wherein the signal is output if a deviation of the present charging current curve from the charging current curve characterizing the vehicle is above a threshold.

8. The method according to claim 1, wherein a charging current characterizing the charging station is calculated for each respective charging station from the stored charging currents curves with different vehicle identifications.

9. The method according to claim 1, wherein the charging current curve characterizing the vehicle is calculated as an average value of the stored charging current curves for the vehicle identification, and/or wherein the charging current curve characterizing the charging station is calculated as an average value of the stored curves of charging currents for the charging station.

10. The method according to claim 1, wherein for in each charging station, the charging current curves with different vehicle identifications are compared with a present curve of a charging current for a vehicle identification depending on the signal.

11. The method according to claim 1, wherein a temperature is stored together with the charging current curve, and charging current curves in a temperature range are assigned to one another, and/or
wherein information about a cable set is stored together with the charging current curve, and charging currents curves with corresponding cable sets are associated with one another.

12. A method for capturing charging current curves for electric vehicles at charging stations comprising:
 capturing of a charging current curve at a charging station using a smartmeter of the charging station,
 storing of the charging current curve together with a vehicle identification of the charging vehicle in the smartmeter,
 wherein
 for each vehicle identification a charging current curve at a plurality of charging stations is stored, and
 for the respective vehicle identification, the smartmeter compares a present charging current curve with the stored charging current curves at the plurality of charging stations and in case of a deviation of the present charging current curve from the stored charging current curves at the plurality of charging stations which is greater than a threshold, the smartmeter outputs a signal.

13. A method for detecting a defective smartmeter of a charging station for electric vehicles comprising:
 capturing of a charging current curve at a charging station,
 storing of the charging current curve together with a vehicle identification of the charging vehicle,
 wherein
 for each vehicle identification a charging current curve at a plurality of charging stations is stored, and
 for the respective vehicle identification, a present charging current curve is compared with the stored charging current curves at the plurality of charging stations and in case of a deviation of the present charging current curve from the stored charging current curves at the plurality of charging stations which is greater than a threshold, a signal is output.

14. A method for capturing charging current curves for electric vehicles at a plurality of charging stations, each charging station of the plurality of charging stations being in communication with a central computer and each charging station of the plurality of charging stations comprising a smartmeter, the method comprising:
 capturing of a charging current curve at a charging station,
 storing of the charging current curve together with a vehicle identification of the charging vehicle,
 wherein
 for each vehicle identification a charging current curve at a plurality of charging stations is stored, and
 for the respective vehicle identification, a present charging current curve is compared with the stored charging current curves at the plurality of charging stations and in case of a deviation of the present charging current curve from the stored charging current curves at the plurality of charging stations which is greater than a threshold, a signal is output.

* * * * *